United States Patent
Sawanobori

(10) Patent No.: US 11,804,449 B2
(45) Date of Patent: Oct. 31, 2023

(54) SEMICONDUCTOR DEVICE AND MANUFACTURING METHOD THEREOF

(71) Applicant: Kioxia Corporation, Tokyo (JP)

(72) Inventor: Akihito Sawanobori, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 28 days.

(21) Appl. No.: 17/462,981

(22) Filed: Aug. 31, 2021

(65) Prior Publication Data

US 2022/0246539 A1 Aug. 4, 2022

(30) Foreign Application Priority Data

Feb. 3, 2021 (JP) .................................. 2021-015672

(51) Int. Cl.
*H01L 23/552* (2006.01)
*H01L 23/31* (2006.01)
*H01L 21/56* (2006.01)
*H01L 23/00* (2006.01)

(52) U.S. Cl.
CPC .......... *H01L 23/552* (2013.01); *H01L 21/568* (2013.01); *H01L 23/3121* (2013.01); *H01L 24/48* (2013.01); *H01L 24/83* (2013.01); *H01L 24/97* (2013.01); *H01L 2224/48227* (2013.01); *H01L 2924/181* (2013.01); *H01L 2924/3025* (2013.01)

(58) Field of Classification Search
CPC ... H01L 23/552; H01L 23/3121; H01L 24/48; H01L 24/83; H01L 24/97; H01L 2224/48227; H01L 2924/181; H01L 2924/3025
See application file for complete search history.

(56) References Cited

U.S. PATENT DOCUMENTS

| | | | |
|---|---|---|---|
| 7,989,928 B2 | 8/2011 | Liao et al. | |
| 10,256,195 B2 | 4/2019 | Yamamoto et al. | |
| 10,541,210 B2 | 1/2020 | Jung et al. | |
| 2003/0068522 A1* | 4/2003 | Wang | H01L 23/53214 |
| | | | 257/E21.582 |
| 2009/0256244 A1 | 10/2009 | Liao et al. | |
| 2017/0033086 A1* | 2/2017 | Homma | H01L 25/0657 |
| 2017/0358540 A1 | 12/2017 | Min et al. | |
| 2018/0286817 A1 | 10/2018 | Kitazaki et al. | |
| 2020/0288608 A1 | 9/2020 | Umeda et al. | |

FOREIGN PATENT DOCUMENTS

| | | |
|---|---|---|
| CN | 107507823 A | 12/2017 |
| JP | 2007-243122 | 9/2007 |
| JP | 2018-170416 A | 11/2018 |
| TW | 201705434 A | 2/2017 |

* cited by examiner

*Primary Examiner* — Timor Karimy

(74) *Attorney, Agent, or Firm* — Foley & Lardner LLP

(57) ABSTRACT

According to one embodiment, a semiconductor device includes a substrate; a semiconductor chip provided on the substrate; a resin covering the semiconductor chip; and a metal film provided on the resin. The metal film includes a first metal layer provided on the resin, a second metal layer provided on the first metal layer, and a third metal layer provided on the second metal layer. The first metal layer and the second metal layer contain a same material, and a particle diameter of the second metal layer is smaller than a particle diameter of the first metal layer.

7 Claims, 5 Drawing Sheets

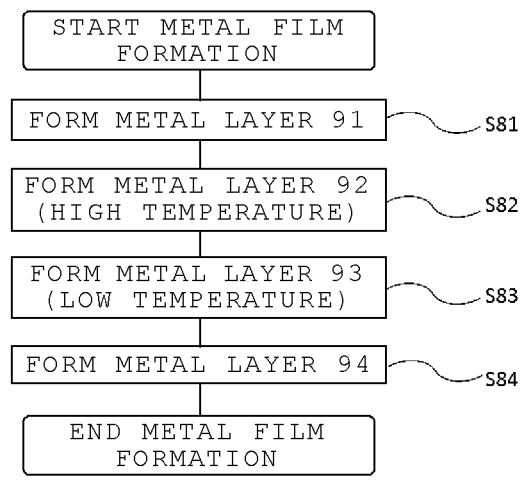
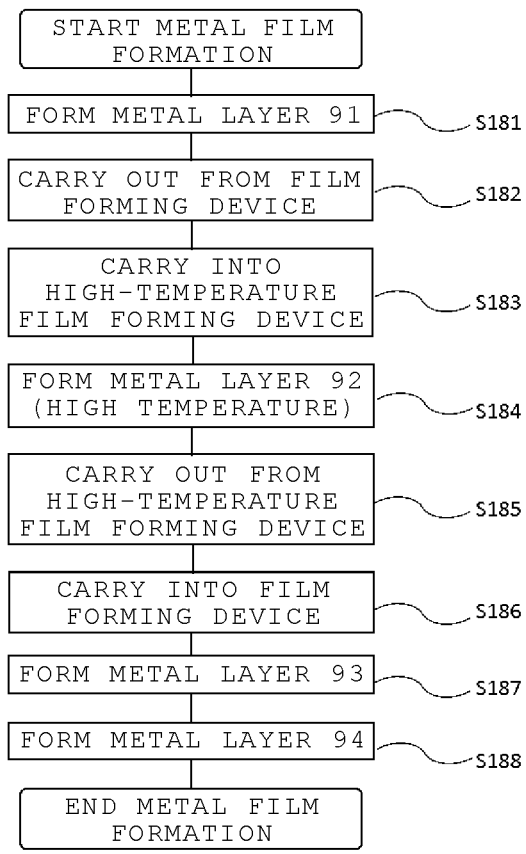

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2021-015672, filed Feb. 3, 2021, the entire contents of which are incorporated herein by reference.

FIELD

Embodiments described herein relate generally to a semiconductor device and a manufacturing method of the semiconductor device.

BACKGROUND

To prevent electromagnetic interference (EMI) generated from a semiconductor device, a plurality of metal films may be formed as an electromagnetic shield on the surface of the semiconductor device. When inspecting characteristics of the semiconductor device, the outer metal film of the plurality of metal films may be scraped and the inner metal film may be exposed.

DESCRIPTION OF THE DRAWINGS

FIG. 8 shows a flowchart of the manufacturing method of the semiconductor device according to the first embodiment.

FIG. 9 shows a flowchart of another manufacturing method of the semiconductor device according to the first embodiment.

DETAILED DESCRIPTION

Figure 1:
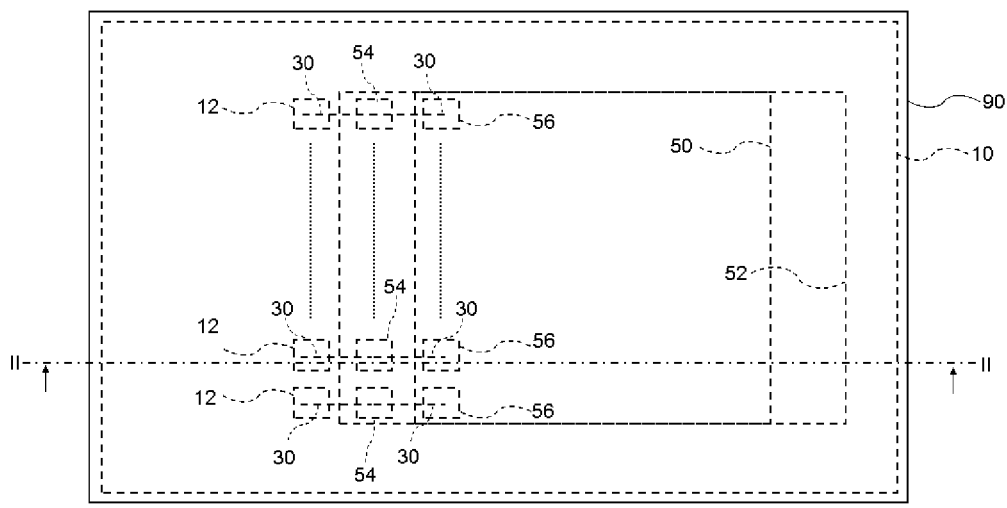
FIG. 1 shows a schematic top view of a semiconductor device according to a first embodiment.

Embodiments provide a semiconductor device which is not easily damaged and has good shielding properties, and a manufacturing method of the semiconductor device.

In general, according to one embodiment, a semiconductor device includes a substrate; a semiconductor chip provided on the substrate; a resin covering the semiconductor chip; and a metal film provided on the resin. The metal film includes a first metal layer provided on the resin, a second metal layer provided on the first metal layer, and a third metal layer provided on the second metal layer. The first metal layer and the second metal layer contain a same material, and a particle diameter of the second metal layer is smaller than a particle diameter of the first metal layer.

Hereinafter, embodiments of the present disclosure will be described with reference to drawings. The present embodiment does not limit the present disclosure. In the following embodiment, a vertical direction indicates a relative direction of the surface on which a semiconductor chip is mounted on a wiring substrate as above, and may be different from a vertical direction according to the gravitational acceleration. The drawings are schematic or conceptual, and the ratio of each part is not necessarily the same as the actual one. In the specification and drawings, elements similar to those described above with reference to the drawings are given the same reference numerals, and the detailed description thereof will be omitted. When the cross section of a metal layer is captured by an X ray, an optical microscope, or the like, and the area of the cross section of a crystal grain appearing in the cross section is obtained, the area of the cross section is assumed to be the area of a circle, and the diameter of the circle may be the particle diameter of the crystal grain. When there are a plurality of crystal grains in the cross section, the average value of all the crystal grains in a measurement range may be set to a particle diameter.

First Embodiment

Figure 2:
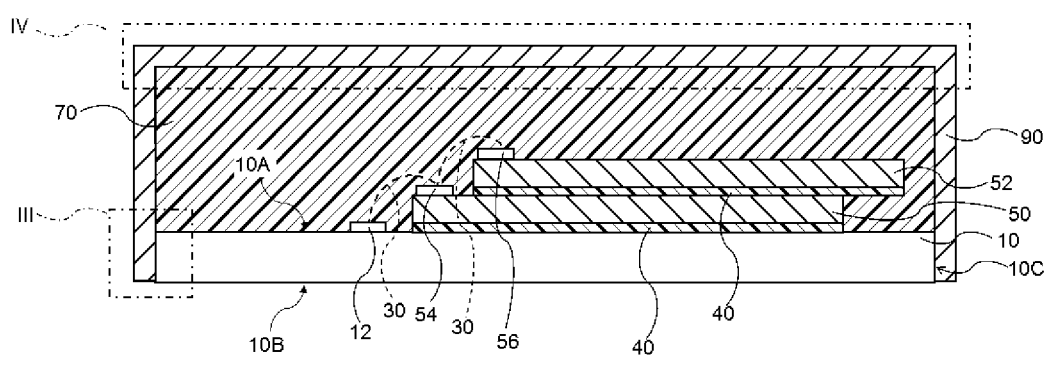
FIG. 2 shows a schematic sectional view of the semiconductor device according to the first embodiment.

FIG. 1 is a top view showing an example of the configuration of a semiconductor device according to a first embodiment. FIG. 2 is a sectional view cut along the line II-II in FIG. 1.

A semiconductor device 1 includes a wiring substrate 10, semiconductor chips 50 and 52, a bonding wire 30, a resin layer 70, and a metal film 90. The wiring substrate 10 includes a first surface 10A, a second surface 10B on an opposite side to the first surface 10A, and a side surface 10C between the first surface 10A and the second surface 10B. Wiring layers 13 to 16 (see FIG. 3) and an interlayer insulating film 17 for insulating the wiring layers are provided in the wiring substrate 10. The interlayer insulating film 17 may be a glass epoxy resin or a ceramic. The wiring substrate 10 may be, for example, a printed substrate or an interposer using a glass epoxy resin. The wiring substrate 10 includes a pad 12 that is electrically connected to any of internal wirings thereof. The first surface 10A of the wiring substrate 10 other than the pad 12 may be covered with an insulating film such as solder resist (not shown). The pad 12 includes aluminum, gold, copper, or a composite material thereof.

The semiconductor chip 50 is provided on the first surface 10A of the wiring substrate 10. The semiconductor chip 50 is bonded onto the first surface 10A of the wiring substrate 10 by an adhesive layer 40. The semiconductor chip 52 is bonded onto the semiconductor chip 50 by the adhesive layer 40. The adhesive layer 40 may be a paste-like or film-like resin such as non conductive past (NCP) or die attach film (DAF). The number of stacked semiconductor chips may be more than 2. Only the semiconductor chip 50 may be used without staking. A controller chip for controlling the other semiconductor chips 50 and 52 may be stacked. A controller chip may be separately provided on the first surface 10A.

The semiconductor chip 50 includes a pad 54 electrically connected to any of the semiconductor elements formed on the surface thereof. The semiconductor chip 52 includes a pad 56 electrically connected to any of the semiconductor elements formed on the surface thereof. The pads 54 and 56 include aluminum, gold, copper or a composite material thereof.

The bonding wire 30 connects the pads 12 and 54. The bonding wire 30 connects the pads 54 and 56. The bonding wire 30 is, for example, a metal wire including an Au wire, a Cu wire, an Ag wire, a Pd-coated Cu wire, and the like.

The resin layer 70 seals and protects the semiconductor chips 50 and 52 and the bonding wire 30 on the wiring substrate 10. The resin layer 70 may not be provided on the side surface 10C of the wiring substrate 10. The resin layer 70 is a thermosetting resin, for example, an epoxy resin or an acrylic resin. The resin layer 70 may be a resin material containing an inorganic filler not shown. The inorganic filler is, for example, silica, that is, silicon oxide. As the inorganic filler, aluminum hydroxide, calcium carbonate, aluminum oxide, boron nitride, titanium oxide, barium titanate or the like may be added in addition to the silica.

The metal film 90 covers the surface and side surface of the resin layer 70. The metal film 90 covers up to the side surface 10C of the wiring substrate 10 and is electrically connected to a part of the wiring of the wiring substrate 10 on the side surface 10C.

Figure 3:
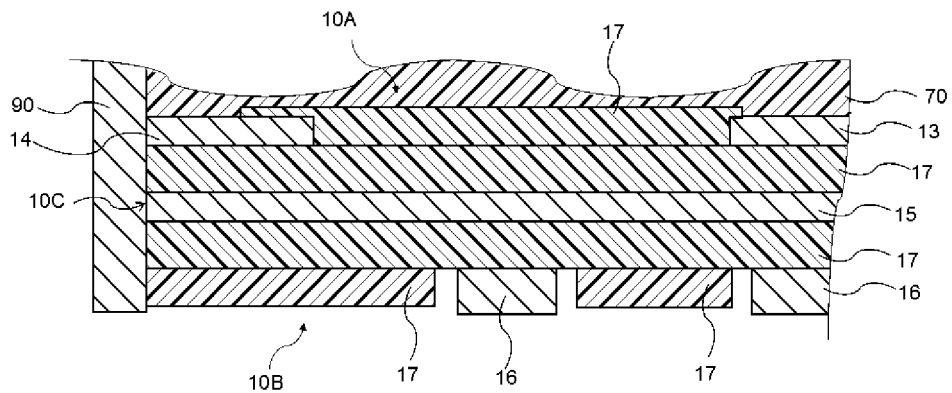
FIG. 3 shows a partially enlarged sectional view of the semiconductor device according to the first embodiment.

FIG. 3 is a sectional view showing the configuration of the frame III in FIG. 2 in more detail. The wiring substrate 10 includes the wiring layers 13 to 16 as a part of the wiring layer. The wiring layer 16 is provided on the second surface 10B side. The wiring layer 15 is provided above the wiring layer 16. The wiring layers 13 and 14 are provided above the wiring layer 15. The wiring substrate 10 may further include other wiring layers. The interlayer insulating film 17 is provided between each of the wiring layers 13 to 16. The wiring layer 13 may be connected to the pad 12 or may function as the pad 12. The wiring layer 16 may also function as a pad on the second surface 10B side and may be connected to an external terminal not shown by providing a Cu pillar or the like on the wiring layer 16.

On the side surface 10C of the wiring substrate 10, some wiring layers 14 and 15 are exposed from the interlayer insulating film 17. The wiring layers 14 and 15 exposed from the interlayer insulating film 17 are connected, for example, to a predetermined voltage (for example, a ground voltage). The metal film 90 covers the side surface 10C of the wiring substrate 10 and is electrically connected to the wiring layers 14 and 15. Thus, the metal film 90 is grounded via the wiring layers 14 and 15. As a result, the metal film 90 can function as an electromagnetic shield.

Figure 4:
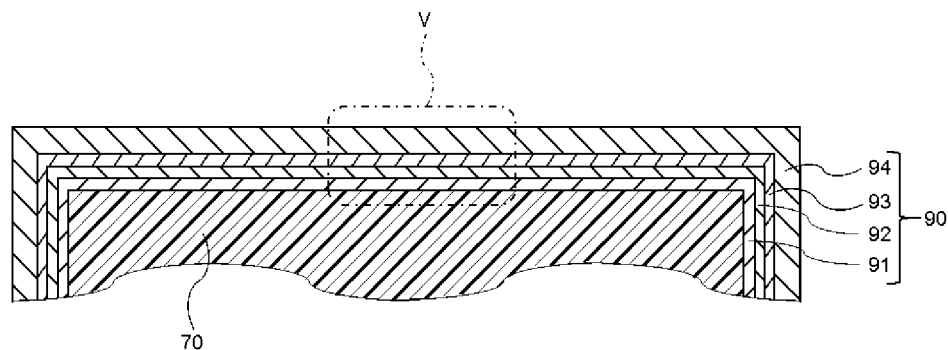
FIG. 4 shows a partially enlarged sectional view of the semiconductor device according to the first embodiment.

FIG. 4 is a sectional view showing the configuration of the frame IV of FIG. 2 in more detail. FIG. 4 shows only the upper part of the semiconductor device 1. The metal film 90 covered on the surface and side surface of the resin layer 70 includes a stacked film of a metal layer 91, a metal layer 92, a metal layer 93, and a metal layer 94.

The metal layer 91 covers the surface and side surface of the resin layer 70 and the side surface 10C of the wiring substrate 10. As the metal layer 91, for example, a metal material containing stainless steel, nickel or titanium is used. The film thickness of the metal layer 91 is, for example, about 100 nm to 300 nm.

The metal layer 92 is provided on the metal layer 91 and covers the surface and side surface of the resin layer 70 and the side surface 10C of the wiring substrate 10 via the metal layer 91. The metal layer 92 is a material different from the metal layer 91 and the metal layer 94 and has a lower resistance than the metal layer 91, the metal layer 93, and the metal layer 94. As the metal layer 92, for example, a metal material such as copper or a compound containing copper is used. The film thickness of the metal layer 92 is, for example, about 1.5 µm to 2.5 µm. The average particle diameter of the metal layer 92 is about 0.15 µInto 0.5 µm. The metal layer 92 has a specific resistance of less than 2.0 µΩ·cm.

Figure 5:
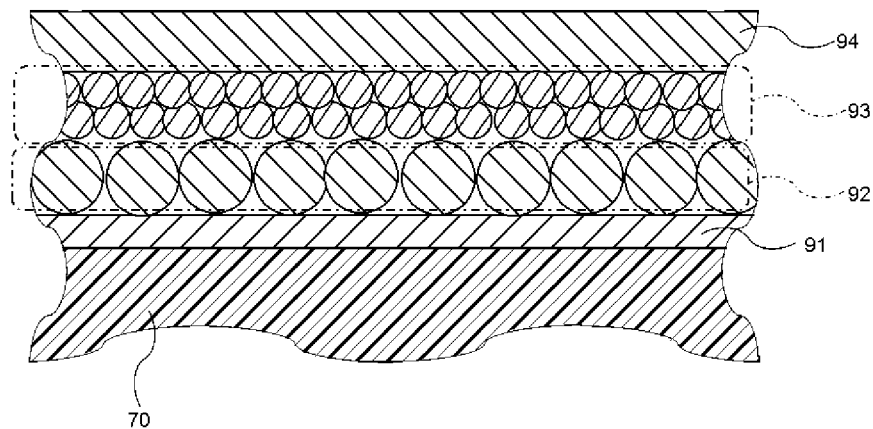
FIG. 5 shows a partially enlarged sectional view of the semiconductor device according to the first embodiment.

The metal layer 93 is provided on the metal layer 92 and covers the surface and side surface of the resin layer 70 and the side surface 10C of the wiring substrate 10 via the metal layer 91 and the metal layer 92. As the metal layer 93, for example, a metal material such as copper or a compound containing copper is used, which is identical to the material configuring the metal layer 92. As shown in FIG. 5, the particle diameter of the metal layer 93 is smaller than that of the metal layer 92. The film thickness of the metal layer 93 is, for example, about 0.3 µInto 1.5 µm. The average particle diameter of the metal layer 93 is less than 0.15 µm. The metal layer 93 has a specific resistance of 2.0 µΩ·cm or more. The total film thickness of the metal layers 92 and 93 is, for example, 1.7 µm to 4.0 µm. The total film thickness is preferably, 1.7 µm to 3.0 µm.

The metal layer 94 is provided on the metal layer 93 and covers the surface and side surface of the resin layer 70 and the side face 10C of the wiring substrate 10 via the metal layer 91, the metal layer 92, and the metal layer 93. The metal layer 94 covers the metal layer 93 and becomes the outermost layer of the semiconductor device 1. As the metal layer 94, for example, a metal material containing stainless steel, nickel or titanium is used. The metal layer 94 may be made of the same material as the metal layer 91. The film thickness of the metal layer 94 is, for example, about 300 nm to 900 nm.

Effect

Figure 6A:
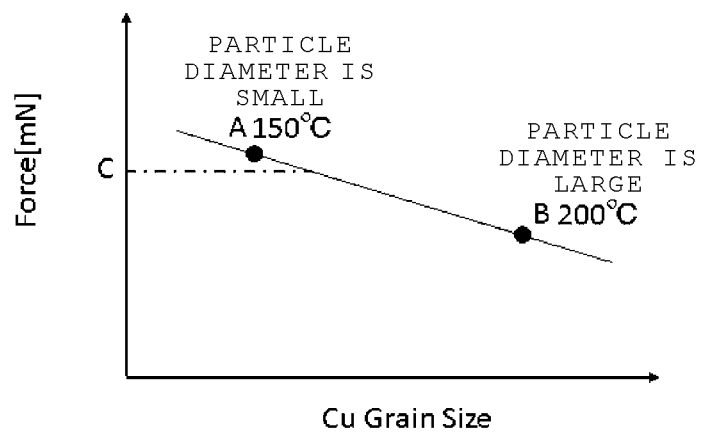
FIG. 6A shows a characteristic view of the semiconductor device according to the first embodiment.

FIG. 6A shows an illustration of the size of the particle diameter of the metal layer 93 and the adhesion to the metal layer 94. The vertical axis of the FIG. 6A shows how much force is applied to the metal layer 94 to expose the metal layer 93. The horizontal axis shows the particle diameter of the metal layer 93. As shown in FIG. 6A, if the standard value of force for preventing peeling is CmN, the standard is satisfied in a case of A having a smaller particle diameter, but the standard cannot be satisfied in a case of B having a larger particle diameter. Thus, the adhesion between the metal layer 93 and the metal layer 94 is improved by reducing the particle diameter of the metal layer 93, and the metal layer 94 is not easily peeled from the metal layer 93. That is, the metal layer 94 can more surely protect the metal layer 93.

Figure 6B:
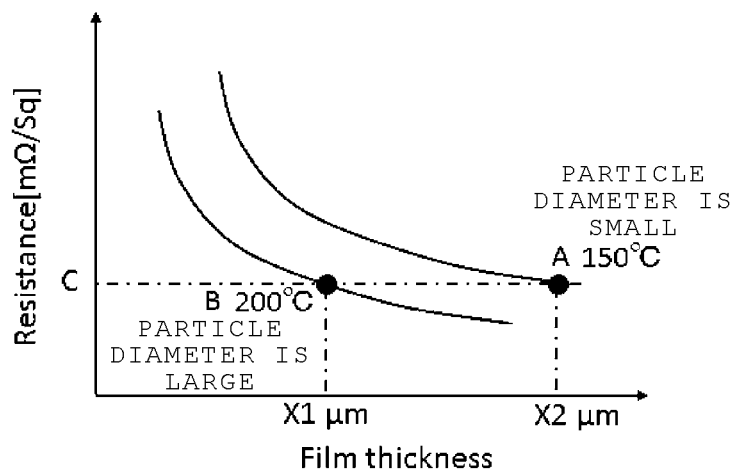
FIG. 6B shows a characteristic view of the semiconductor device according to the first embodiment.

The resistance value of the metal layer 93 and the dependence of the particle diameter are shown in FIG. 6B. In the case of B having a large particle diameter in the line B of FIG. 6B, the resistivity can be reduced if the film has the same film thickness, and a sufficient electromagnetic shielding effect can be obtained. On the other hand, in the case of the line A having a small particle diameter in FIG. 6B, the resistivity becomes high. In this case, a sufficient electromagnetic shielding effect cannot be obtained. For example, if the standard value of resistivity is C mΩ/Sq, X1 µm may be required when the particle diameter is large, but X2 µm larger than X1 µm is required when the particle diameter is small. Accordingly, when the metal film 90 is formed of only the metal layer 91, the metal layer 93, and the metal layer 94 without the metal layer 92 being interposed therebetween to satisfy the adhesion and the resistivity, the film thickness of the metal layer 93 is required to be sufficiently thick. However, to make the film thickness of the metal layer 93 sufficiently large, the film formation takes time, and the cost is increased.

(a) The metal layer 92 having a large particle diameter is interposed between the metal layer 91 and the metal layer 93. Even if the film thickness of the metal layer 92 is thin, the resistivity can be reduced. Thus, sufficient adhesion and electromagnetic shielding effect can be obtained at a lower cost as compared to a sufficient thickness of the metal layer 93.

(b) By using the same material for the metal layer 92 and the metal layer 93, the adhesion between the metal layer 92 and the metal layer 93 can be made stronger than that when using different kinds of materials.

Manufacturing Method of Semiconductor Device of First Embodiment

Figure 7:
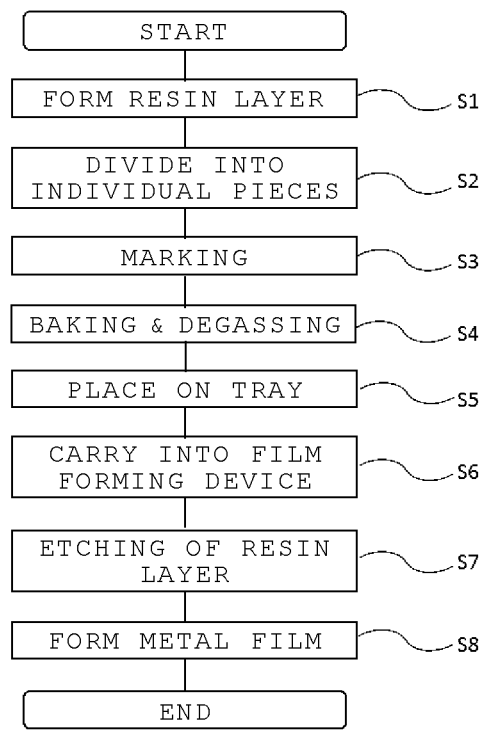
FIG. 7 shows a flowchart of a manufacturing method of the semiconductor device according to the first embodiment.

Next, a manufacturing method of a semiconductor device 1 according to the first embodiment is described. FIGS. 7 and 8 are flow diagrams showing one example of a manufacturing method of a semiconductor device according to the first embodiment.

A method of manufacturing a semiconductor device before performing step S1 in FIG. 7 is described. The semiconductor chip 50 is provided on the first surface 10A of the wiring substrate 10 via the adhesive layer 40. The semiconductor chip 52 is provided on the semiconductor chip 50 via the adhesive layer 40. In this case, a plurality of wiring substrates 10 are still connected and are not divided into individual semiconductor packages.

Next, after cleaning the wiring substrate 10 by plasma, the pad 12 of the wiring substrate 10, the pad 54 of the semiconductor chip 50, and the pad 56 of the semiconductor chip 52 are connected by the bonding wire 30.

The semiconductor chips 50 and 52 are stacked in a direction substantially perpendicular to the first surface 10A. Alternatively, the semiconductor chips may be disposed horizontally on the first surface 10A.

Next, in step S1, the resin layer 70 is provided on the wiring substrate 10 to seal the semiconductor chips 50 and 52 and the bonding wire 30.

In step S2, the wiring substrate 10 is divided into individual pieces in each semiconductor device unit by using a blade to form the semiconductor device 1.

In step S3, marking is performed on the upper surface of the resin layer 70 of the semiconductor device 1 to divide the semiconductor device 1 into individual pieces. For marking, a product name, a manufacturer, a lot number, and the like, are engraved by using a laser marker.

In step S4, the semiconductor device 1 is placed in an oven and is subjected to baking treatment. The baking treatment is, for example, processed at a temperature between 100° C. and 260° C. The moisture contained in the resin layer 70 is evaporated by the baking treatment, and adhesion of the metal film 90 described below can be improved. In addition, deterioration in reliability of the bonding portion, wiring, transistor, and the like is prevented by baking treatment at a temperature of not more than the melting point of the solder, for example, not more than 260° C. Further, by creating a vacuum, gas contained in the resin layer 70 and the wiring substrate 10 may be discharged.

In step S5, a plurality of semiconductor devices 1 are loaded on a tray (not shown) that is resistant to temperatures of 200° C. or higher, such as a metal or heat-resistant plastic.

In step S6, the plurality of semiconductor devices 1 are carried into a decompression chamber having a pressure lower than the atmospheric pressure while placed on the tray.

In step S7, the semiconductor device 1 is conveyed to an etching chamber, and the resin layer 70 is etched in the etching chamber. The resin layer 70 is etched (sputter etching) by using, for example, plasma containing argon (Ar) and nitrogen (N). The ratio of the flow rate of argon to nitrogen may be, for example, 3:7 to 7:3. When the ratio is deviated based on the above range, adhesion between the resin layer 70 and the metal film 90 may decrease. By this etching, the resin layer 70 is selectively etched by about 1 to 100 nm against the inorganic filler. Since the inorganic filler has high adhesion to the metal film 90, the adhesion between the resin layer 70 and the metal film 90 is improved by exposing the inorganic filler.

The semiconductor device 1 is introduced into a film forming chamber in step S8, and the metal film 90 is formed on the upper surface and side surface of the resin layer 70, and the side surface 10C of the semiconductor device 1. The metal film 90 is formed by using, for example, a sputtering method in a state where the plurality of semiconductor devices 1 are placed on the tray. The etching chamber and the film forming chamber may be the same chamber.

As described above, the metal film 90 is a stacked film of the metal layers 91 to 94. The metal layers 91 to 94 are continuously formed in the same decompression chamber while changing the material source of sputtering. As shown in FIG. 5, the metal layer 91 is first formed on the resin layer 70 (S81). For example, when stainless steel is used as the metal layer 91, film formation is performed by sputtering using a source of stainless steel. The film thickness of the stainless steel film is, for example, 100 nm to 300 nm.

Next, the metal layer 92 is formed on the metal layer 91 at about 200° C. (S82). At this time, the tray and the semiconductor device 1 may be heated by a heater or the like. As the metal layer 92, film formation is performed by sputtering using copper or an alloy containing copper as a source. The temperature of the semiconductor device 1 during film formation is about 200° C. As shown in FIG. 6B, the particle diameter of the metal layer 92 is larger than that of copper formed at 150° C., and the metal layer 92 has a relatively low resistance. The film thickness of the metal layer 92 is, for example, about 1.5 μm to 2.5 μm. The average particle diameter of the metal layer 92 is about 0.20 μm to 0.5 μm.

Next, the metal layer 93 is formed on the metal layer 92 at about 150° C. (S83). At this time, heating of the heater or the like is stopped and the semiconductor device 1 may be left for a while until the temperature falls. Film formation is performed by sputtering using the same material as the metal layer 92 as the metal layer 93 as a source. At this time, as shown in FIG. 6A, the particle diameter of the copper alloy of the metal layer 93 is relatively small. As shown in FIG. 6B, the metal layer 93 has higher resistance than the metal layer 92. The film thickness of the metal layer 93 is, for example, about 0.3 μm to 1.5 μm. The average particle diameter of the metal layer 93 is 0.15 μm or less.

Next, the metal layer 94 is formed on the metal layer 93 (S84). For example, when stainless steel is used as the metal layer 94, film formation is performed by sputtering using a source of stainless steel. The film thickness of the stainless steel film is, for example, 300 nm to 900 nm. At this time, the metal layer 94 also becomes a film having a relatively flat and small particle diameter according to the metal layer 93 of the base. The temperature of the metal layer 91, the metal layer 93, and the metal layer 94 during film formation may be substantially the same.

The metal layers 91 to 94 may be formed by a CVD (chemical vapor deposition) method, a vacuum deposition method, and an ion plating method.

The semiconductor device 1 is completed by the above manufacturing method.

Effect (a) If the semiconductor device 1 is placed on a resin tape, for example, not resistant to a temperature of 150° C. or higher, and sputtering is performed, it is necessary to form the metal layers 92 and 93 at a temperature of less than 150° C. Accordingly, the particle diameters of the metal layers 92 and 93 become small and the resistance value becomes relatively high. In contrast, in the present embodiment, the wiring substrate 10 is mounted on a tray that is resistant to higher temperatures than the resin tape, and sputtering is performed. Accordingly, the metal layer 92 can be formed at 200° C. at a temperature of 150° C. or higher, and the particle diameter thereof can be increased. As a result, the metal layer 92 has a relatively low resistance. By forming the metal layer 92 at a high temperature of about 200° C. and the metal layer 93 at a low temperature of 150° C., the metal layer 92 having a low resistance and low adhesion to the metal layer 94 is combined with the metal layer 93 having a high resistance and high adhesion to the metal layer 94, and electromagnetic shielding performance and adhesion can be made compatible.

(b) Since the metal layer 92 and the metal layer 93 are the same material, film formation can be performed by using the same source, thereby reducing the cost.

(c) Since the metal layer 92 and the metal layer 93 are formed in the same chamber, the number of film forming chambers can be reduced, thereby reducing the cost.

Other Manufacturing Methods

FIG. 9 shows another manufacturing method of the semiconductor device 1. The metal film 90 is a stacked film of the metal layers 91 to 94. The film thickness, film formation method, film formation temperature, and the like of the metal layers 91 to 94 are substantially identical to the manufacturing method of the semiconductor device 1 in the first embodiment. The metal layers 91 to 94 are formed in different decompression chambers.

The metal layer 91 is formed on the resin layer 70 (S181).

The semiconductor device 1 is carried out from a film forming device in which the metal layer 91 is formed (S182).

The semiconductor device 1 is carried into a high-temperature film forming device different from a first chamber (S183).

The stage of the high-temperature film forming device is already preheated and is at a target film formation temperature. Therefore, in the semiconductor device 1 carried into the high-temperature film-forming device, the metal layer 92 is formed with less waiting time until the temperature rises (S184).

The semiconductor device 1 is carried out from the high-temperature film forming device (S185).

The semiconductor device 1 is carried into the film forming device (S186). At this time, the film forming device may be a device in which another metal layer 91 is formed or a film forming device as a "third chamber" different from the first chamber and a second chamber.

The stage of the film forming device is at a target film formation temperature. Therefore, in the semiconductor device 1 carried into the film-forming device, the metal layer 93 is formed with less waiting time until the temperature falls (S187).

After the metal layer 93 is formed, the metal layer 94 is formed (S188).

The semiconductor device 1 is completed by the other manufacturing method according to the above-described manufacturing method.

Effect (d) The metal layer 92 and the metal layer 93 are formed in different chambers. Accordingly, the waiting time for temperature rise and temperature fall of the chamber is reduced. Thus, in addition to the effects of (a) and (b) of the manufacturing methods of the semiconductor device in the first embodiment, the semiconductor device 1 can be processed in less time.

Other Embodiments (a) In the embodiment, the same source is used for the film formation of the metal layer 92 and the metal layer 93. However, a source of metal copper with a purity of 4N (99.99%) or more may be used only for the metal layer 92, and a source of copper with a purity lower than 4N may be used for the metal layer 93. As a result, the purity of the metal layer 92 also becomes 99.99% or more of copper, and the resistance can be made lower. Further, a source with a low purity can be used for the metal layer 93 which is not required to have a low resistance, thereby reducing the cost. For example, when film formation is performed by sputtering, a copper sputtering target of 4N or more is used for the metal layer 92. A copper sputtering target of 4N or less is used for the metal layer 93.

At this time, even if the purity of copper of the metal layer 93 becomes slightly lower, the adhesion between the metal layer 92 and the metal layer 93 can be maintained because the main material is copper.

(b) In the embodiment, the film formation temperature of the metal layer 93 is 150° C. The film formation temperature of the metal layer 93 may be 150° C. or lower, preferably 120° C. or lower, more preferably 100° C. or lower. In this case, since the particle diameter of the metal layer 93 can be further reduced, adhesion to the metal layer 94 is improved.

(c) In the embodiment, the film formation temperature of the metal layer 92 is 200° C. The effect of increasing the particle diameter is obtained even at 200° C. or lower as long as the temperature is higher than 150° C. The film formation temperature may be 200° C. or higher, preferably 200° C. to 230° C., more preferably 230° C. to 250° C. In this case, since the particle diameter of the metal layer 92 can be further increased, the specific resistance of the metal layer 92 can be reduced.

Figure 10:
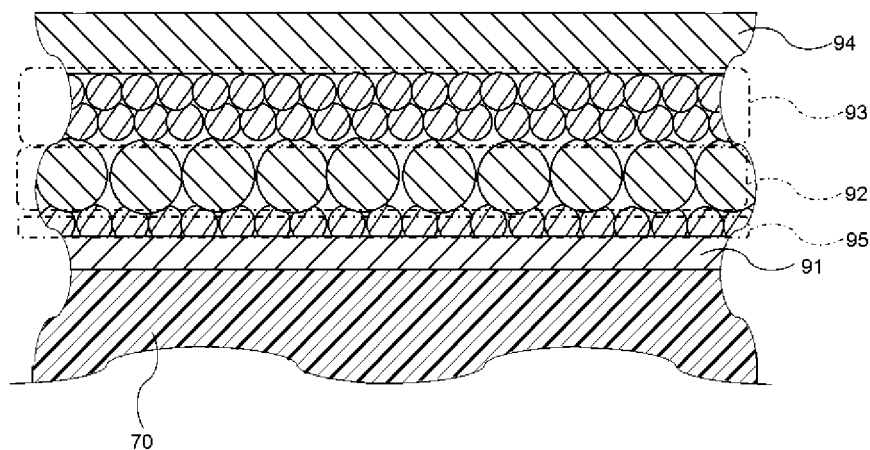
FIG. 10 shows a partially enlarged sectional view of a semiconductor device in other embodiments.

(d) As shown in FIG. 10, the metal layer 95 containing the same material as the metal layer 92 and having a particle diameter smaller than that of the metal layer 92 may be provided between the metal layer 91 and the metal layer 92. The film thickness of the metal layer 95 may be thinner than that of the metal layer 93. The adhesion between the metal layer 91 and the metal layer 95 is strengthened. Further, since the metal layer 92 and the metal layer 95 contain the same material, the adhesion between the metal layer 92 and the metal layer 95 can be enhanced. At this time, the metal layer 95 may be formed at 150° C. or less in the same manner as the metal layer 93.

(e) In the embodiment, the film formation temperature is a set temperature such as a stage of the film forming device. However, temperature is measured while film formation is performed by attaching a temperature sensor or the like to the semiconductor device, and the actually measured temperature of the semiconductor device at that time may be used as the film formation temperature.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a substrate;
a semiconductor chip provided on the substrate;
a resin covering the semiconductor chip; and
a metal film provided on the resin, wherein
the metal film includes a first metal layer provided on the resin, a second metal layer provided on the first metal layer, and a third metal layer provided on the second metal layer, and
the first metal layer and the second metal layer contain a same material, and a particle diameter of the second metal layer is smaller than a particle diameter of the first metal layer, wherein the particle diameter of the first metal layer of at least 0.20 µm and no more than 0.5 µm, and the particle diameter of the second metal layer is 0.15 µm or less.

2. The semiconductor device according to claim 1, wherein
the first metal layer and the second metal layer contain copper.

3. The semiconductor device according to claim 1, wherein
the first metal layer has a film thickness of at least 1.5 µm and no more than 2.5 µm, and the second metal layer has a film thickness of at least 0.3 µm and no more than 1.5 µm.

4. The semiconductor device according to claim 1, wherein
the first metal layer contains copper with a purity of 99.99% or more, and the second metal layer contains copper with a purity of less than 99.99%.

5. The semiconductor device according to claim 1, wherein
the resistance of the first metal layer is less than 2.0 µΩ·cm.

6. The semiconductor device of claim 1, wherein a resistance of the second metal layer is higher than a resistance of the first metal layer.

7. The semiconductor device of claim 1, wherein the metal film further includes a fourth metal layer containing at least one of stainless steel, nickel and titanium.

* * * * *